US008517517B2

(12) United States Patent
Abe et al.

(10) Patent No.: US 8,517,517 B2
(45) Date of Patent: Aug. 27, 2013

(54) LIQUID DISCHARGE HEAD AND METHOD FOR MANUFACTURING THE SAME

(75) Inventors: Hiroshi Abe, Tokyo (JP); Toshiaki Hirosawa, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 30 days.

(21) Appl. No.: 13/154,187

(22) Filed: Jun. 6, 2011

(65) Prior Publication Data
US 2011/0310163 A1    Dec. 22, 2011

(30) Foreign Application Priority Data

Jun. 16, 2010    (JP) .................................. 2010-137472

(51) Int. Cl.
*B41J 2/05* (2006.01)
(52) U.S. Cl.
USPC ........................................................... 347/58
(58) Field of Classification Search
CPC .................................................. B41J 2/14072
USPC .......................................... 347/20, 50, 57, 58
See application file for complete search history.

(56) References Cited

U.S. PATENT DOCUMENTS
2010/0271431 A1* 10/2010 Kawamura ..................... 347/50

FOREIGN PATENT DOCUMENTS
JP    08-187860 A    7/1996

* cited by examiner

*Primary Examiner* — An Do
(74) *Attorney, Agent, or Firm* — Canon USA Inc IP Division

(57) ABSTRACT

A liquid discharge head includes a recording element substrate including an energy generation element for generating energy used to discharge a liquid and a terminal electrically connected to the energy generation element, and an electric wiring board including an electrode electrically connected to the terminal via a wire to transmit an electric signal supplied from outside to the energy generation element, wherein the terminal has an area twice or more larger than a contact area between the terminal and the wire and the electrode has an area twice or more larger than a contact area between the electrode and the wire.

7 Claims, 5 Drawing Sheets

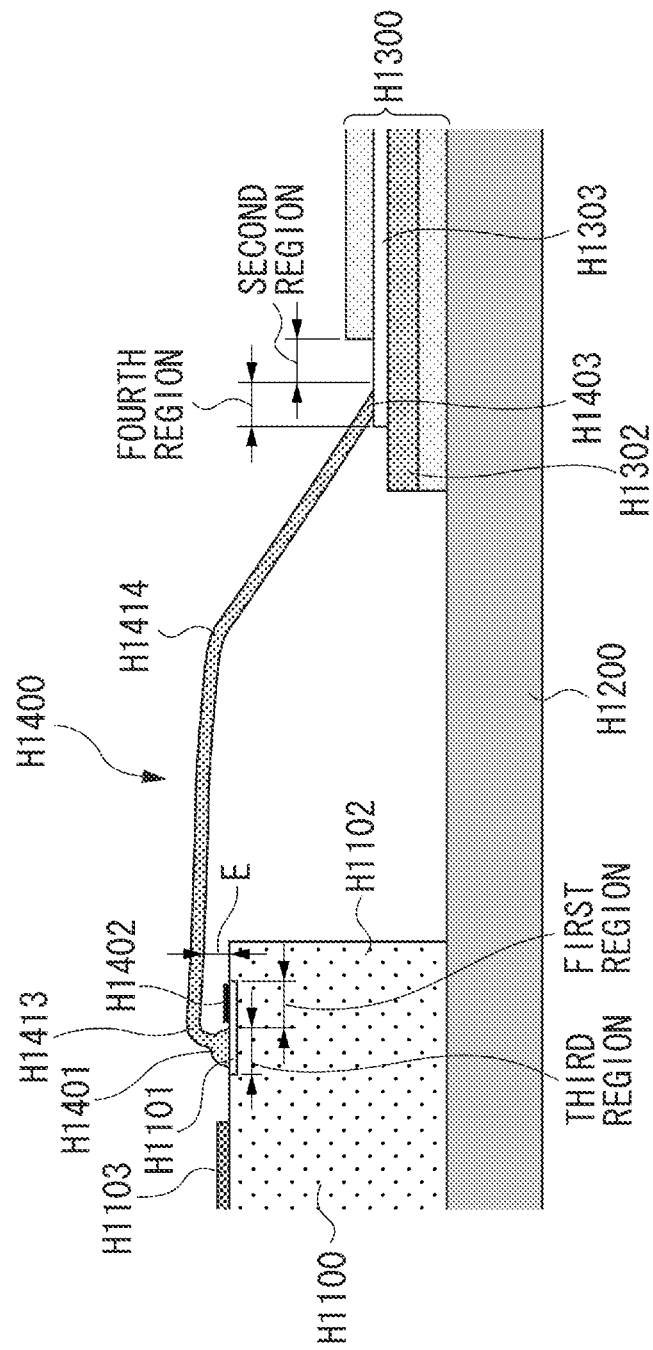

LIQUID DISCHARGE HEAD AND METHOD FOR MANUFACTURING THE SAME

BACKGROUND OF THE INVENTION

1. Field of the Invention

The present invention relates to a liquid discharge head that performs a recording operation by discharging a liquid such as ink to a recorded medium such as recording paper and a method for manufacturing the liquid discharge head.

2. Description of the Related Art

In a conventional liquid discharge head, bump bonding or wire bonding to a tape automated bonding (TAB) film is used in an electric connection technique between a recording element substrate and an electric wiring board such as a flexible wiring board. Further, a full-line type liquid discharge head including a liquid discharge head having a width comparable to a print width is known as a form of the liquid discharge head.

The flexible wiring board applied to a full-line type liquid discharge head is used to apply an electric signal for discharging ink to the recording element substrate from outside. The flexible wiring board includes an electrode terminal corresponding to an electrode of the recording element substrate and an external signal input terminal positioned at a wiring edge to receive an electric signal from a recording apparatus body. The flexible wiring board and the recording element substrate are electrically connected by a wire bonding technique using a gold wire or the like. The electrode of the recording element substrate, the electrode terminal of the flexible wiring board, and the gold wire are sealed by a sealing agent and protected from corrosion by ink or an external impact.

Ball bonding is commonly used as the wire bonding technique. The shape of a wire after wire bonding is generally a mountain shape in which the wire rises up from a wire start-edge and passes a bending point before reaching a wire end-edge. In recent years, however, various low-loop formation techniques have been developed to suppress the height of a wire, leading to diversification of wire shapes.

Poor conduction or a defective shape that occurs after the wire bonding in common wire bonding connection is handled as a failure in the manufacturing process of ink jet heads. For a full-line type liquid discharge head in which a plurality of recording element substrates is arranged, however, many recording element substrates are mounted and the number of wires to be connected increases, so that the probability that poor connection in wire bonding occurs may increase. Thus, a manufacturing yield of liquid discharge heads may be lowered, and manufacturing costs may increase. Japanese Patent Application Laid-Open No. 08-187860 discusses a configuration in which a plurality of wires is stacked and connected to an electric connection portion connected by a wire to reduce failures due to wire bonding. If the configuration is used, even if an out-of-spec wire causing poor conduction is found by a test after wire bonding, connection can be established by another wire connected to the same connection portion, so that the manufacturing yield of the liquid discharge head can be prevented from decreasing due to a defective wire.

However, the following issue is found to occur if this configuration is applied to an ink jet head. More specifically, according to the configuration discussed in Japanese Patent Application Laid-Open No. 08-187860, a plurality of wires with different heights is connected to the same connection portion. Thus, the height of wires formed in the end increases according to the number of wires connected to the same connection portion and therefore, even if the low-loop formation technique is used, the height of the wire located at the highest position will be relatively high.

One effective element to improve print quality in an ink jet recording apparatus is to make a head-to-paper distance smaller. The head-to-paper distance is an interval between a discharge port surface on which a discharge port for discharging ink droplets is formed and recording paper that receives discharged ink droplets. If the head-to-paper distance is large, deterioration in the print quality is caused by lower precision with which ink dots are impacted onto the recording paper or deformed dot shapes. One cause of the increasing head-to-paper distance is the height of wires of wire bonding and the sealing agent covering the wires. The height of the sealing agent is almost the same as the height of wire and thus, making the wire height of wire bonding as low as possible is effective in making the head-to-paper distance smaller.

SUMMARY OF THE INVENTION

The present invention is directed to a liquid discharge head including a wire bonding configuration that can decrease an occurrence of defective head caused by defective wires in wire bonding and suppress an increase in wire height.

According to an aspect of the present invention, a liquid discharge head includes a recording element substrate including an energy generation element for generating energy used to discharge a liquid and a terminal electrically connected to the energy generation element, and an electric wiring board including an electrode electrically connected to the terminal via a wire to transmit an electric signal supplied from outside to the energy generation element, wherein the terminal has an area twice or more larger than a contact area between the terminal and the wire and the electrode has an area twice or more larger than a contact area between the electrode and the wire.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 3A and 3B illustrate a cross section of a wire connection portion. FIG. 3A is a sectional view of a connection form in a first exemplary embodiment, and FIG. 3B is a sectional view of the connection form in a second exemplary embodiment.

DESCRIPTION OF THE EMBODIMENTS

Various exemplary embodiments, features, and aspects of the invention will be described in detail below with reference to the drawings.

Figure 1:
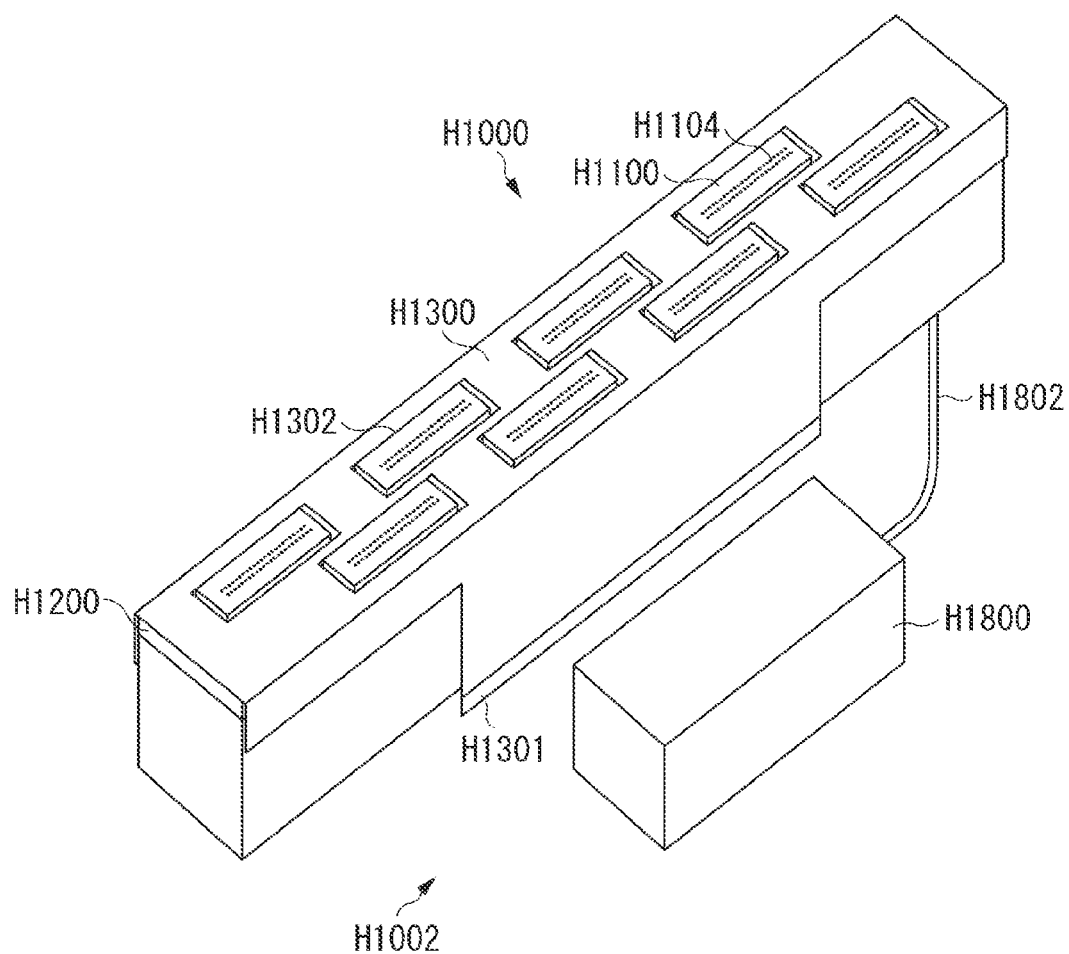
FIG. 1 is a schematic perspective view illustrating an exemplary embodiment of a liquid discharge head.
Figure 2:
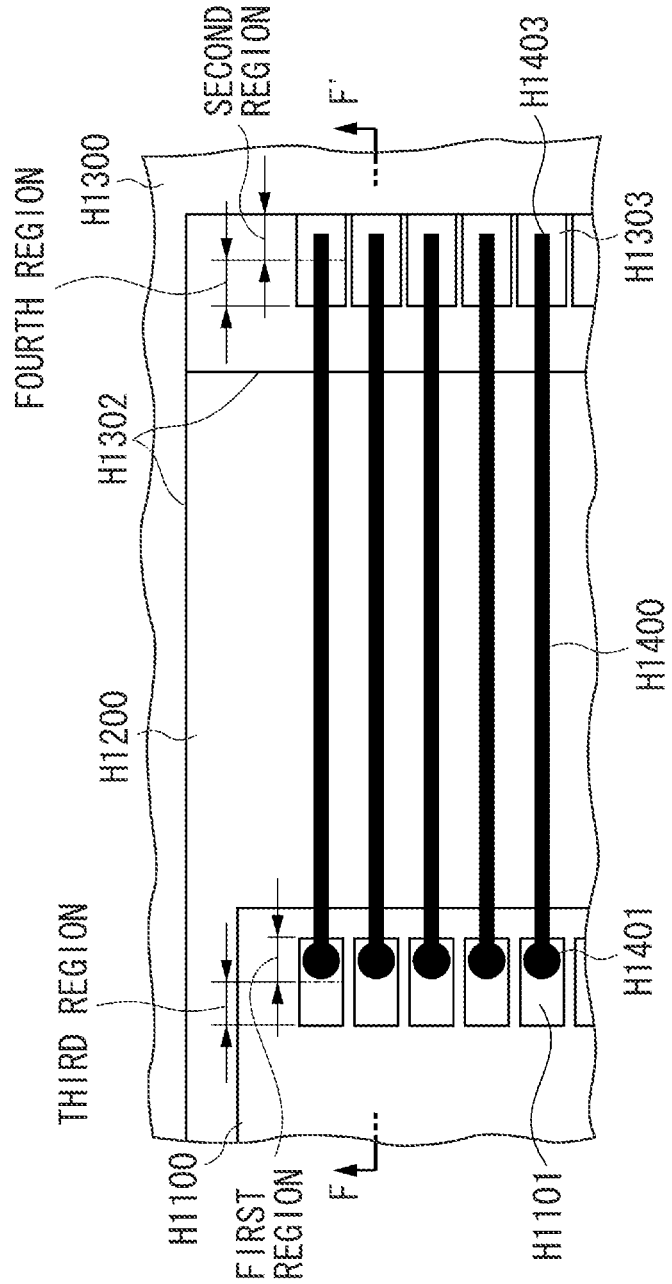
FIG. 2 is an enlarged view of a wire bonding portion of the liquid discharge head in the exemplary embodiment.

FIG. 1 is a perspective view illustrating a liquid discharge head H1000 having a wire bonding structure in a first exemplary embodiment and an ink tank H1800 accommodating ink supplied to the liquid discharge head H1000. FIG. 2 illustrates an enlarged view of a wire bonding portion of the liquid discharge head illustrated in FIG. 1 and illustrates a state before the wire bonding portion being sealed by a sealing agent.

A recording element substrate H1100 includes a board H1102 made of silicon (Si) and a flow path member H1103 (see FIGS. 3A and 3B) formed on the board H1102. The board H1102 includes an energy generation element for generating energy used to discharge a liquid, a drive circuit thereof, and a bonding pad H1101 which is an electrode terminal for supplying a drive signal and electric power to the drive circuit. In the present exemplary embodiment, the energy generation element is formed by a heating element (heater).

A supply port for supplying ink corresponding to each energy generation element is formed in the board H1102 constituting the recording element substrate H1100. A discharge port H1104 through which ink is discharged is formed in the flow path member H1103. A plurality of the recording element substrates H1100 is arranged on a support substrate H1200 made of alumina ($Al_2O_3$). A flexible electric wiring board H1300 including a device hole H1302 which is an opening containing the recording element substrate H1100 is arranged on the support substrate H1200.

The bonding pad H1101 formed at an edge of the recording element substrate H1100 and a lead H1303 which is a wire stretching from the electric wiring board H1300 are electrically connected via a wire H1400.

A drive signal which is transmitted from outside the liquid discharge head (a main body of the ink jet recording apparatus) to the liquid discharge head and is an electric signal for driving the liquid discharge head and power are input from a connector H1301 arranged on the electric wiring board H1300. Then, the drive signal and power reach the lead H1303 that is an electrode terminal of the electric wiring board H1300 via a circuit wiring inside the electric wiring board H1300, then are supplied to the recording element substrate H1100 via a wire.

In the wire bonding portion of the recording element substrate H1100, a plurality of the bonding pads H1101 serving as electrode terminals is arranged in one line along one side of the edge of the recording element substrate H1100. The bonding pad H1101 has a rectangular shape and is arranged in such a way that a short side thereof is in a direction along one side of the edge of the recording element substrate H1100 and long sides are mutually adjacent to each other.

On the other hand, a plurality of the leads H1303 serving as electrode terminals is formed in the wire bonding portion of the electric wiring board H1300. The leads H1303 face to the bonding pads H1101 of the recording element substrates H1100 arranged inside the device holes H1302 and are arranged in one line along an opening side of the device holes H1302. The lead H1303 has a rectangular shape and is arranged in such a way that a short side thereof is in a direction along one side of the opening of the device hole H1302 and long sides are mutually adjacent to each other.

In the present exemplary embodiment, each of the bonding pads H1101 formed on the recording element substrate H1100 has a rectangular shape and has bonding regions for wire bonding corresponding to the number of a plurality of wires along a longitudinal direction thereof. The bonding pad H1101 has a space, in which two or more regions each of which is necessary for one (once) bonding can be arranged along the longitudinal direction of the pad, in an exposure region where the pad is exposed. In other words, the bonding pad H1101 has an area twice or more than a contact area of the connection portion of a wire and the bonding pad.

For example, if the start-edge of ball bonding is bonded, it is sufficient to provide a plurality of (two or more) regions larger than a ground region of a crimping ball H1401 along the longitudinal direction. The bonding pad H1101 in the present exemplary embodiment has, as illustrated in FIG. 2, two regions (a first region and a third region) each of which is larger than the ground region of the crimping ball H1401 and is formed along the longitudinal direction of the pad. More specifically, the size of the bonding pad H1101 is set to 220*110 μm, which allows two crimping balls H1401 for ball bonding whose crimping diameter is about φ 90 μm to be grounded in the longitudinal direction of the bonding pad.

Each of the leads H1303 of the electric wiring board H1300 has a rectangular shape and has a plurality of bonding regions for bonding wires along the longitudinal direction thereof. As illustrated in FIG. 2, regions (a second region and a fourth region) in which two bonding capillaries can be grounded are formed. More specifically, the size of the lead H1303 is set to 230*120 μm, which allows two capillaries to be grounded for bonding whose capillary ground diameter is about φ 100 μm.

Figure 3A:
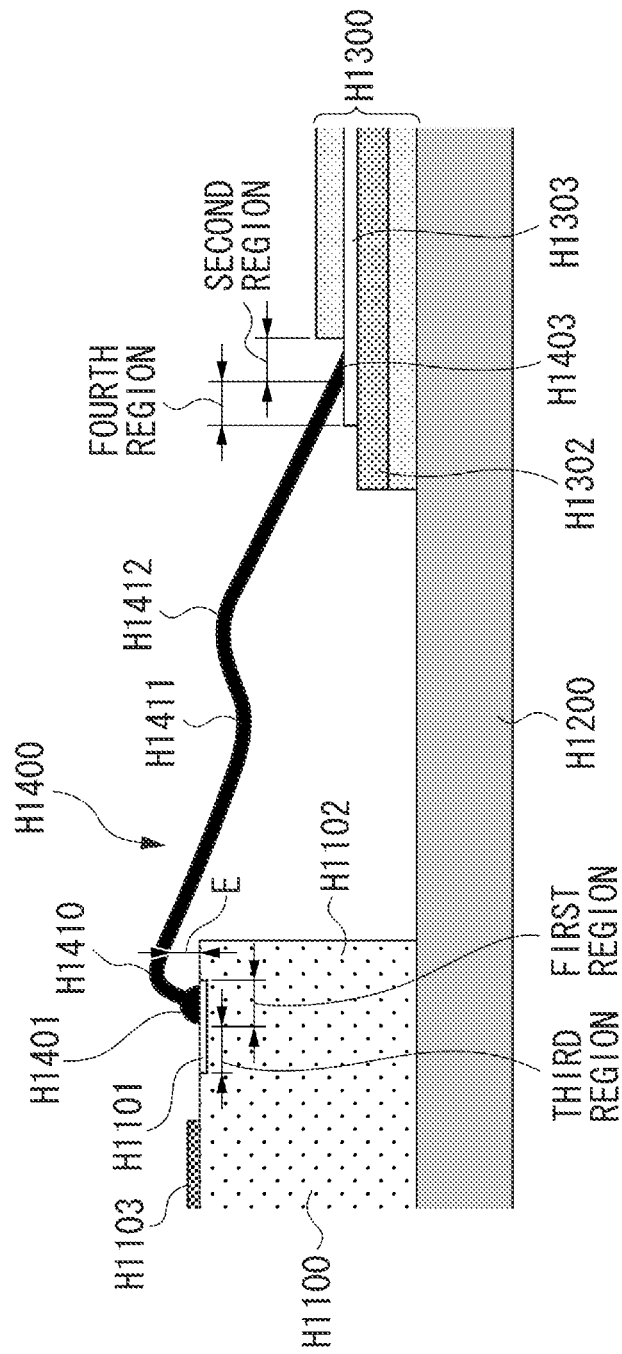

FIGS. 3A and 3B illustrate a sectional view of a configuration in which the bonding pad H1101 and the lead H1303 are connected by a wire, which is a portion of the sectional view along the line FF' in FIG. 2. In FIG. 3A, the start-edge of ball bonding in the bonding pad provided on the recording element substrate H1100 is assumed to be the first region on an edge side (electric wiring board side) of the recording element substrate of the first region and the third region in which a region for two bonding portions is secured. A ball bonding end-edge H1403 in the lead H1303 provided on the electric wiring board H1300 is assumed to be the second region, which is the opposite side of the recording element substrate side from the center of the lead H1303 (electrode) in which a region for two bonding portions is secured. Moreover, the wire H1400 is assumed to have a shape in which main bending points are provided at three locations.

The wire H1400 rises from the start-edge of ball bonding of the bonding pad H1101 and is bent at a bending point 1 (H1410) at an angle of 90 degrees or more with respect to a direction perpendicular to the surface of the recording element substrate, which is a wire connection surface. In other words, after stretching in a direction (upward) away from the support substrate H1200 from the start-edge, the wire stretches toward the support substrate side (downward) via the bending point. Next, the wire stretching from the bending point 1 (H1410) further stretches in a direction (upward) away from the support substrate H1200 via a bending point 2 (H1411). Then, the wire from the bending point 2 stretches toward the support substrate H1200 side (downward) again via a bending point 3 (H1412). Lastly, the wire via the bending point 3 stretches to the ball bonding end-edge H1403.

A case when, as illustrated in FIG. 3A, the bonding pad H1101 of the recording element substrate H1100 is arranged at a position higher than the lead H1303 of the electric wiring board H1300 will be described. In such a case, it is necessary to secure a large edge clearance E to prevent the wire from coming into contact with the recording element substrate while suppressing the maximum height of the wire. For this purpose, the wire shape is adjusted in such a way that the bending point 1 (H1410) becomes the highest point of the wire. Compared with a wire shape having one bending point, three bending points as illustrated in FIG. 3A can be employed because if the wire is deformed, each bending point is displaced or deformed, so that an increase in the maximum height of the wire can be suppressed and the head-to-paper distance can be secured. In other words, many bending points can be employed because when a wire is deformed, a deformed amount can be absorbed by each bending portion and regions between the bending portions.

If the first region or the second region of each electrode terminal in the above configuration is selected, the third region and the fourth region that can be used for wire bonding remain in each electrode terminal region after electrodes are connected by wire bonding. In the present exemplary embodiment, the start-edge of wire bonding is provided on the recording element substrate H1100 edge side (first region) of the connection region which is provided more than one in the bonding pad H1101. Such configuration is preferable because the large edge clearance E, which is the distance between the wire and board surface, can be secured at a board edge where the wire H1400 for connecting between electrodes easily comes into contact with the recording element substrate H1100.

It is assumed in the present exemplary embodiment that there are two regions which can be used for wire bonding, however, it is only necessary to secure two or more regions. Regarding the distance between connection regions, the interval between the first region and the second region and the interval between the third region and the fourth region may be different. Further, combinations of connection regions are not limited to the connection between the first region and the second region and the connection between the third region and the fourth region. The connection between the first region and the fourth region and the connection between the second region and the third region may be used as long as both of the maximum height of the wire and the edge clearance fall within desired ranges. Furthermore, the wire bonding method between the electrode terminals is not limited to the ball bonding, and wedge bonding may also be used.

Figure 4:
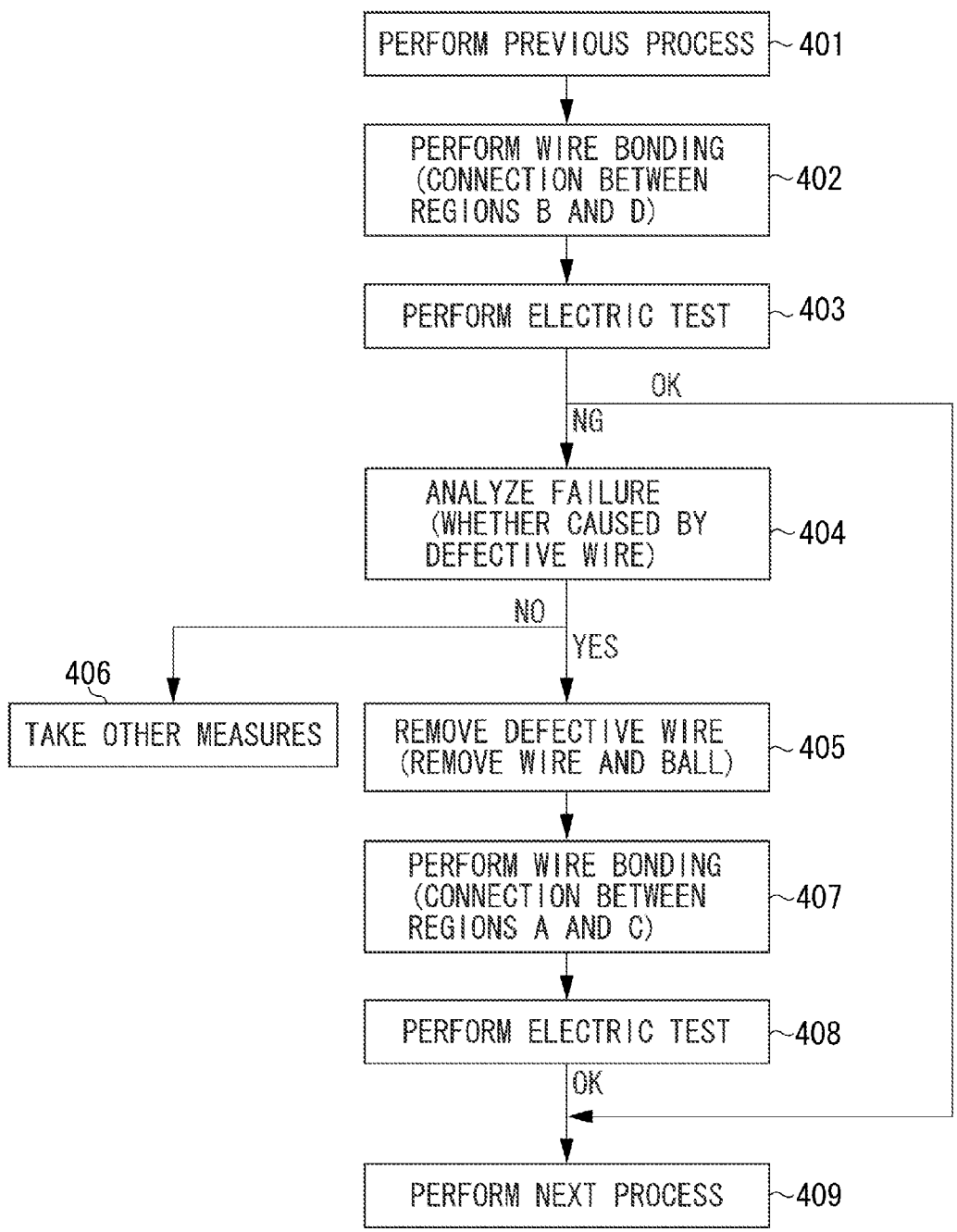
FIG. 4 is a flow chart illustrating a wire bonding process.

In a second exemplary embodiment, a configuration is described which, when an out-of-spec wire causing poor conduction is found by a test after wire bonding and poor electric connection occurs between the electrodes, electrically connects between the both electrodes by re-forming a wire in the regions which remain in both electrodes and can be used for wire bonding. In the present exemplary embodiment, an electrical characteristic test of the liquid discharge head is performed to check for any occurrence of defect in the wire-bonding portion after the wire-bonding process described in the first exemplary embodiment ends. FIG. 4 illustrates a flow chart of a wire bonding manufacturing process.

First, as described in the first exemplary embodiment, the first region and the second region of each electrode are connected by wire bonding (first connection step: 402). Next, in step 403, an electrical characteristic test of the wire is performed.

If a test result is OK (OK in step 403), the process proceeds to the next process (step 409). If the test result is determined to be no good (NG in step 403), then in step 404, whether the cause thereof is a specific wire failure is determined. If, as a result of the analysis, the cause is a specific wire failure (YES in step 404), wire bonding is performed again. If another failure is the cause (NO in step 404), then in step 406, measures are taken separately if necessary.

The configuration when wire bonding is performed again is illustrated in FIG. 3B and the flow thereof is illustrated in FIG. 4. When wire bonding is performed again, the third region and the fourth region that are free regions remaining in the electrode terminals are used. However, before performing the wire bonding to the third region and the fourth region, it is necessary to remove the specific defective wire formed between the first region and the second region (step 405).

As a method for removing a wire, pulling out by a wire clamp operation and a peel strength test operation performed by a tweezers peel strength test apparatus or pulling out by a micro-manipulator can be applied. If a distance between adjacent wires is relatively large, the wire can be pulled out by manual work using tweezers. In all cases, it is necessary to remove the defective wire in such a way that adjacent normal wires are not deformed or damaged.

After the defective wire is pulled out, it is necessary to prevent a portion of the crimping ball H1401 remaining in the first region of the bonding pad H1101 from exerting an influence such as coming into contact with a capillary when wire bonding is again performed to the third region adjacent to the first region. Thus, the crimping ball H1401 needs to be completely removed from the bonding pad H1101 without any residue or to be thinly processed (as portion H1402) to such an extent that no interference occurs with the re-formed wire H1400.

Processing methods may include peeling from the board by tweezers of a bump pull test, peeling or shearing using shear tools of a shear strength measuring apparatus, and a squash method by a flip chip bonder. Also in this case, a method that does not deform or damage adjacent normal wires may be used (step 405 in FIG. 4).

In the liquid discharge head in which wire bonding is performed again (second connection step: 407) for a portion of wires as described above, a plurality of types of wire bonding is mixed. In other words, a wire (first wire) connecting the first region of the bonding pad H1101 and the second region of the lead H1303 and a wire (second wire) connecting the third region of the bonding pad H1101 and the fourth region of the lead H1303 are mixed.

FIG. 3B illustrates the configuration in which the third region of the bonding pad H1101 and the fourth region of the lead H1303 are connected by a wire. The start-edge of ball bonding to the bonding pad H1101 is the third region and the ball bonding end-edge H1403 to the lead H1303 is the fourth region. In this case, the wire H1400 has a shape different from the configuration in FIG. 3A illustrated above and includes bending points provided at two locations. The wire rises up from the start-edge of ball bonding of the bonding pad H1101 and has a bending point 4 (H1413), at which the wire is bent at an angle of 90 degrees or more with respect to a direction perpendicular to the surface of the recording element substrate, which is the wire connection surface. In other words, after stretching in a direction (upward) away from the support substrate H1200 from the start-edge of ball bonding, the wire stretches toward the support substrate side (downward) via the bending point 4 (H1413).

Next, the wire stretches toward the support substrate H1200 (downward) again via a bending point 5 (H1414) following the bending point 4 (H1413) and further stretches toward the ball bonding end-edge H1403. If the bonding pad H1101 of the recording element substrate H1100 is arranged at a position higher than the lead H1303 of the electric wiring board H1300, the configuration described below can be employed. More specifically, in order to secure a large edge clearance E' while suppressing the maximum height of the wire, the wire from the bending point 4 to the bending point 5 may stretch in a direction along the surface of the recording element substrate, preferably substantially parallel to the surface.

Such a wire shape can be employed since the large edge clearance E' can be secured even when the third region whose board edge is apart from the bonding region used for connection in the recording element substrate. Further, by employing such a configuration, the ball residue remained in the first region after removing the defective wire can be prevented from coming into contact with a wire.

Accordingly, even when wire bonding is performed again, the maximum height of the wire can be made comparable to the maximum height of the wire of normal wire bonding. In other words, if the recording element substrate is higher than the electric wiring board, it is preferable that the first region and the second region can be connected by the wire for the initial electric connection, and the third region and the fourth region are connected by the wire when electric connection is established again after a failure.

The length of the wire (second wire) used to connect the third region and the fourth region is substantially equal to the length of the wire (first wire) used to connect the first region and the second region, so that the length of the wire formed between each region can be substantially equal. Accordingly, wire expansion and contraction due to a temperature change becomes substantially the same among the wires, and thus, a difference of connection reliability of wire bonding can also be suppressed.

In step 408, after the wire bonding is performed again, an electric test of the wire bonding portion is performed. If no failure is found, then in step 409, the process proceeds to the next process.

In the present exemplary embodiment described above, the first region and the second region are first connected by wire bonding and the third region and the fourth region are connected for a defective portion. The present invention is not limited to the above example and may employ a connection in a reverse manner. However, if an influence of an edge touch is taken into consideration, it is preferable to connect the relatively higher side from the support substrate H1200, that is, the first region closer to an edge of the recording element substrate H1100 first. Accordingly, an occurrence of failure due to the edge touch can be reduced when compared with a case of using the third region.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-137472 filed Jun. 16, 2010, which is hereby incorporated by reference herein in its entirety.

What is claimed is:

1. A liquid discharge head, comprising:
    a recording element substrate including an energy generation element for generating energy used to discharge a liquid and a terminal electrically connected to the energy generation element; and
    an electric wiring board including an electrode electrically connected to the terminal via a wire to transmit an electric signal supplied from outside to the energy generation element,
    wherein a center of the terminal and a center of a contact portion where the terminal and the wire contact are displaced with each other, and a center of the electrode and a center of a contact portion where the electrode and the wire contact are displaced with each other,
    wherein the terminal has an area twice or more larger than a contact area between the terminal and the wire and the electrode has an area twice or more larger than a contact area between the electrode and the wire.

2. The liquid discharge head according to claim 1, further comprising a wire connecting a first region on a side of the electric wiring board from a center of the terminal in a longitudinal direction of the terminal and a second region on a side opposite to a side of the recording element substrate from a center of the electrode in a longitudinal direction of the electrode.

3. The liquid discharge head according to claim 1, further comprising: a first wire connecting a first region on a side of the electric wiring board from a center of the terminal in a longitudinal direction of the terminal and a second region on a side opposite to a side of the recording element substrate from a center of the electrode in a longitudinal direction of the electrode; and a second wire connecting a third region on a side opposite to the side of the electric wiring board from the center of the terminal in the longitudinal direction of the terminal and a fourth region on the side of the recording element substrate from the center of the electrode in the longitudinal direction of the electrode.

4. The liquid discharge head according to claim 3, wherein the number of bending portions of the first wire is larger than the number of bending portions of the second wire.

5. The liquid discharge head according to claim 3, wherein an interval between the first region and the second region is equal to an interval between the third region and the fourth region.

6. The liquid discharge head according to claim 1, further comprising a support substrate configured to support the recording element substrate and the electric wiring board, wherein an interval between the terminal and the support substrate is larger than an interval between the electrode and the support substrate.

7. The liquid discharge head according to claim 1, wherein the contact portion where the terminal and the wire contact is arranged to an area other than the center of the terminal, and the contact portion where the electrode and the wire contact is arranged at a position other than the center of the electrode.

* * * * *